(12) United States Patent
Murtagh

(10) Patent No.: US 6,867,627 B1
(45) Date of Patent: Mar. 15, 2005

(54) DELAY-LOCKED LOOP (DLL) INTEGRATED CIRCUITS HAVING HIGH BANDWIDTH AND RELIABLE LOCKING CHARACTERISTICS

(75) Inventor: Paul Murtagh, Duluth, GA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/663,624

(22) Filed: Sep. 16, 2003

(51) Int. Cl.$^7$ .................................................. H03L 7/06
(52) U.S. Cl. ..................................... 327/158; 327/149
(58) Field of Search ................................ 327/158, 149, 327/153, 161, 162, 163; 331/DIG. 2; 375/373, 374, 375, 376

(56) References Cited

U.S. PATENT DOCUMENTS

| | | | |
|---|---|---|---|
| 5,485,490 A | 1/1996 | Leung et al. ................ 375/371 |
| 5,614,855 A | 3/1997 | Lee et al. .................... 327/158 |
| 6,100,735 A * | 8/2000 | Lu .............................. 327/158 |
| 6,125,157 A | 9/2000 | Donnelly et al. ........... 375/371 |
| 6,295,328 B1 | 9/2001 | Kim et al. ................... 375/376 |
| 6,501,312 B1 | 12/2002 | Nguyen ....................... 327/161 |
| 6,501,328 B1 | 12/2002 | Gauthier et al. ............ 327/551 |
| 6,504,408 B1 | 1/2003 | von Kaenel ................ 327/158 |
| 6,518,807 B1 | 2/2003 | Cho ............................ 327/158 |
| 6,539,072 B1 | 3/2003 | Donnelly et al. ........... 375/371 |
| 6,584,021 B2 | 6/2003 | Heyne et al. ............... 365/194 |
| 6,584,578 B1 | 6/2003 | Faue ........................... 713/503 |
| 6,586,978 B2 | 7/2003 | Stief ........................... 327/158 |
| 6,593,786 B2 | 7/2003 | Jung ........................... 327/158 |
| 6,727,739 B2 * | 4/2004 | Stubbs et al. ............... 327/161 |
| 2003/0052719 A1 | 3/2003 | Na .............................. 327/158 |
| 2003/0058014 A1 | 3/2003 | Krishnamurty ............. 327/158 |
| 2003/0067334 A1 * | 4/2003 | Brass et al. ................. 327/158 |
| 2003/0067335 A1 | 4/2003 | von Kaenel ................ 327/158 |
| 2003/0071668 A1 | 4/2003 | Starr .......................... 327/157 |
| 2003/0090296 A1 | 5/2003 | Yoo ............................ 327/12 |
| 2003/0094984 A1 | 5/2003 | Weis et al. .................. 327/182 |
| 2003/0095009 A1 | 5/2003 | Gomm et al. ............... 331/57 |
| 2003/0099321 A1 | 5/2003 | Juan et al. ................... 375/376 |
| 2003/0108139 A1 | 6/2003 | Jung ........................... 375/376 |
| 2003/0117193 A1 | 6/2003 | Lee ............................. 327/158 |
| 2003/0117194 A1 | 6/2003 | Lee ............................. 327/158 |
| 2003/0141910 A1 | 7/2003 | Reindl ........................ 327/158 |
| 2003/0151433 A1 | 8/2003 | Takai .......................... 327/158 |
| 2003/0154417 A1 | 8/2003 | Drexler ....................... 713/400 |
| 2003/0154447 A1 | 8/2003 | Gauthier et al. ............ 716/2 |

OTHER PUBLICATIONS

Moon et al., "An All–Analog Multiphase Delay–Locked Loop Using a Replica Delay Line for Wide–Range Operation and Low–Jitter Performance," IEEE Journal of Solid–State Circuits, vol. 35, No. 3, Mar. 2000.

Lee et al., "A 2.5 V CMOS Delay–Locked Loop for an 18 Mbit, 500 Megabyte/s DRAM," IEEE Journal of Solid–State Circuits, vol. 29, No. 12, Dec. 1994, pp. 1491–1496.

* cited by examiner

Primary Examiner—Linh My Nguyen
(74) Attorney, Agent, or Firm—Myers Bigel Sibley & Sajovec

(57) ABSTRACT

Delay-locked loops have high bandwidth locking characteristics that are less susceptible process, voltage and temperature (PVT) variations. These DLLs are configured to support transition from a partial feedback loop lock condition to a full feedback loop lock condition during a start-up time interval, in order to insure that a multi-cycle lock condition is established at the time the DLL's clock signal output becomes available. The DLL may include a variable delay line that is responsive to a reference clock signal, an auxiliary phase detector that is electrically coupled to the variable delay line, and a main phase detector that is responsive to the reference clock signal and a feedback clock signal (DLLCLK). The auxiliary phase detector may be an edge-triggered SR-type phase detector and the main phase detector may be a three-state phase frequency detector.

20 Claims, 3 Drawing Sheets

DELAY-LOCKED LOOP (DLL) INTEGRATED CIRCUITS HAVING HIGH BANDWIDTH AND RELIABLE LOCKING CHARACTERISTICS

FIELD OF THE INVENTION

The present invention relates to integrated circuit devices and, more particularly, to integrated circuit devices having clock generators therein and methods of generating clock signals.

BACKGROUND OF THE INVENTION

Phase-locked loop (PLL) and delay-locked loop (DLL) integrated circuits are frequently used to generate highly accurate internal clock signals on integrated circuit substrates (e.g., chips). However, such conventional PLL and DLL integrated circuits are frequently susceptible to unwanted clock skew and jitter as clock speed and circuit integration levels are increased. In particular, PLLs typically suffer from phase error accumulation that may persist for long periods of time in noisy environments, whereas DLLs may have lower jitter performance because phase error accumulation does not occur. Thus, DLLs may offer an important alternative to PLLs in cases where a reference clock signal comes from a low-jitter source. However, DLLs typically cannot be used in applications where frequency tracking is required, such as frequency synthesis and clock recovery. DLLs may also be difficult to design for environments that experience significant process, voltage and temperature (PVT) variations.

The operating frequency range of conventional DLLs is also frequently limited because DLLs adjust only phase and not frequency. For example, the conventional DLL 10 of FIG. 1 may be limited to a relatively narrow frequency range of operation. As illustrated, the DLL 10 includes a voltage-controlled delay line (VCDL) 12, which generates an output clock signal DLLCLK in response to a reference clock signal REFCLK, a phase detector (PD) 14, charge pump (CP) 16 and a loop filter (LF) 18 that generates an analog control voltage $V_C$. This control voltage $V^C$ is provided as a bias signal to a plurality of identical delay elements 15. When the delay time ($T_{VCDL}$) of the VCDL 12 is initially shorter (or longer) than the period ($T_{CLK}$) of the reference clock signal REFCLK, the DLL 10 automatically adjusts the delay time $T_{VCDL}$ until a phase difference between the reference clock signal REFCLK and the output clock signal DLLCLK is eliminated. This phase difference is detected by sampling the reference clock signal REFCLK with the rising edges of the output clock signal DLLCLK, which is provided as a feedback clock signal. This sampling is performed by the phase detector 14, which generates UP or DOWN pulses that are provided to the charge pump 16. These pulses charge (or discharge) a capacitor in the loop filter 18, thereby decreasing (or increasing) the control voltage $V_C$ and gradually reducing the phase difference by adjusting the delay of the delay elements 15.

Unfortunately, the performance of the DLL 10 of FIG. 1 may be limited by a stuck or harmonic lock problem. To avoid this problem, the minimum delay time ($T_{VCDL-min}$) of the VCDL 12 should be located between ½$T_{CLK}$ and $T_{CLK}$ and the maximum delay time ($T_{VCDL-min}$) of the VCDL 12 should be located between $T_{CLK}$ and 1.5$T_{CLK}$. These relationships result in a maximum range of $T_{CLK}$ as follows: $0.677(T_{VCDL-max}) < T_{CLK} < T_{VCDL-max}$, where $T_{VCDL-max} = 2T_{VCDL-min}$. However, if $T_{VCDL-max} \geq 3T_{VCDL-min}$, there is no range of $T_{CLK}$ that meets these conditions and the DLL 10 becomes prone to the stuck problem. Because the PVT variations associated with the delay time $T_{VCDL}$ can be as much as 2:1 in a typical CMOS process, the stuck-free condition can be satisfied over only a very narrow range of $T_{CLK}$ when the DLL 10 of FIG. 1 is used.

To address these problems associated with conventional DLLs, analog DLLs that utilize replica delay lines have been proposed. For example, FIG. 2 illustrates an analog DLL 20 having a main delay line (within a core DLL) and a replica delay line (RDL) 26 therein. The main delay line includes a plurality of delay elements 25 that generate an output clock signal DLLCLK. This output clock signal DLLCLK is provided as a feedback clock signal to a phase detector 14', which also receives a reference clock signal REFCLK. The core DLL also includes a charge pump 16' and a loop filter 18', which generates a fine-tune control voltage $V_{cp}$. The delay provided by the main delay line is controlled primarily by a control voltage $V_{cr}$ that is generated by the replica delay line 26. The replica delay line 26 consists of a single replica delay cell 25', a current steering phase detector (CSPD) 22 and a low-pass filed (LPF) 24. Because of a sharing of the control voltage $V_{cr}$, the delay time of the replica delay cell 25' is almost equal to the delay time of each of the delay elements 25 in the main delay line. The delay time of the replica delay cell 25' will equal the delay time of each of the delay elements 25 in the main delay line if the fine-tune control voltage $V_{cp}$ equals the bias voltage BIAS. If the current steering phase detector 22 is designed appropriately, the delay time of the replica delay cell 25' can be made to equal one-eighth the period ($T_{CLK}$) of the reference clock signal REFCLK. Accordingly, the delay provided by the main delay line will equal $T_{CLK}$ when the number of delay elements 25 in the main delay line equals eight. In this manner, the wide frequency range of the replica delay line 26 will translate to a core DLL having well established operating frequency bounds and generally stuck-free operation. The DLL 20 of FIG. 2 is more fully described in an article by Y. Moon et al, entitled "An All-Analog Multiphase Delay-Locked Loop Using a Replica Delay Line for Wide-Range Operation and Low-Jitter Performance," IEEE Journal of Solid State Electronics, Vol. 25, No. 3, pp. 377–384, March 2000. Unfortunately, this DLL 20 will typically not lock when the minimum delay of the main delay line plus any fixed delay in the main feedback path is greater than the clock period. Moreover, the use of a replica delay line requires the use of an additional charge pump, which can significantly increase the area and power consumption requirements of the DLL.

Thus, notwithstanding these conventional DLLs, therein continues to be a need for alternative DLLs having stuck-free operation and high degrees of jitter immunity.

SUMMARY OF THE INVENTION

Integrated circuit devices according to embodiments of the present invention include delay-locked loops (DLLs) having wide frequency range operation and reduced clock jitter characteristics. These DLLs utilize a portion of a full feedback loop to set an initial locking state upon start-up and then switch over to a full feedback loop locking condition that is less susceptible to relocking in response to PVT variations. In particular, the DLLs are configured to support transition from a partial feedback loop lock condition to a full feedback loop lock condition during a start-up time interval. These DLLs include a variable delay line and a fixed delay line, that collectively form a full feedback path. An auxiliary phase detector and a main phase detector are utilized to provide a temporary partial loop locking condition that is followed by a full loop locking condition that is maintained throughout the coarse of normal operation (i.e., when the clock signal at the output of the DLL is valid). The auxiliary phase detector has first and second inputs that are connected to ends of a auxiliary delay line that contained within the variable delay line. During start-up, the auxiliary phase detector operates to increase the delay of the delay elements within the variable delay line until the auxiliary delay line becomes locked. The auxiliary phase detector is then disabled at the same time that the main phase detector is enabled. Once enabled, the main phase detector seeks to lock the full feedback loop to multiple cycles of the reference clock. This simultaneous switching-off of the auxiliary phase detector and switching-on of the main phase detector operates to jump the lock condition from a partial cycle condition to a multiple cycle lock condition and thereby skip a full cycle lock condition which may be prone to relocking in response to PVT variations.

DETAILED DESCRIPTION OF PREFERRED EMBODIMENTS

Figure 1:
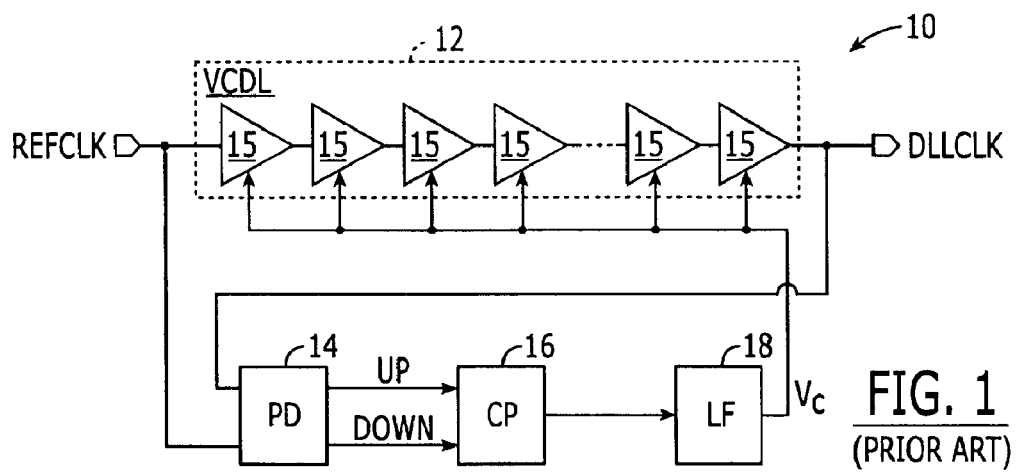
FIG. 1 is an electrical schematic of a delay-locked loop (DLL) according to the prior art.
Figure 2:
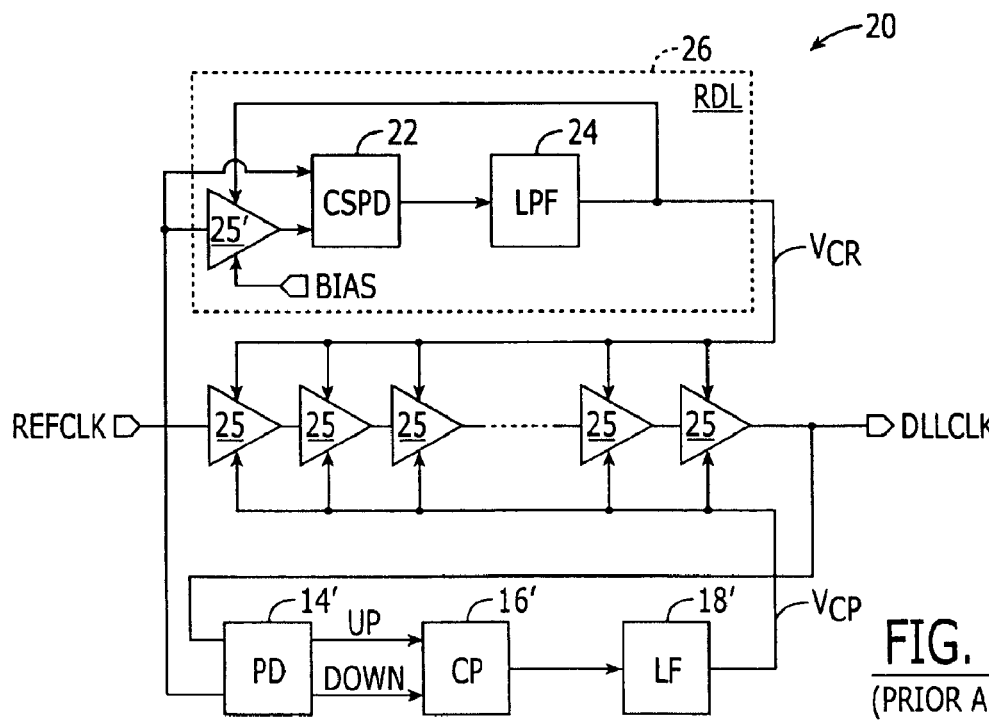
FIG. 2 is an electrical schematic of a delay-locked loop (DLL) according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 3A:
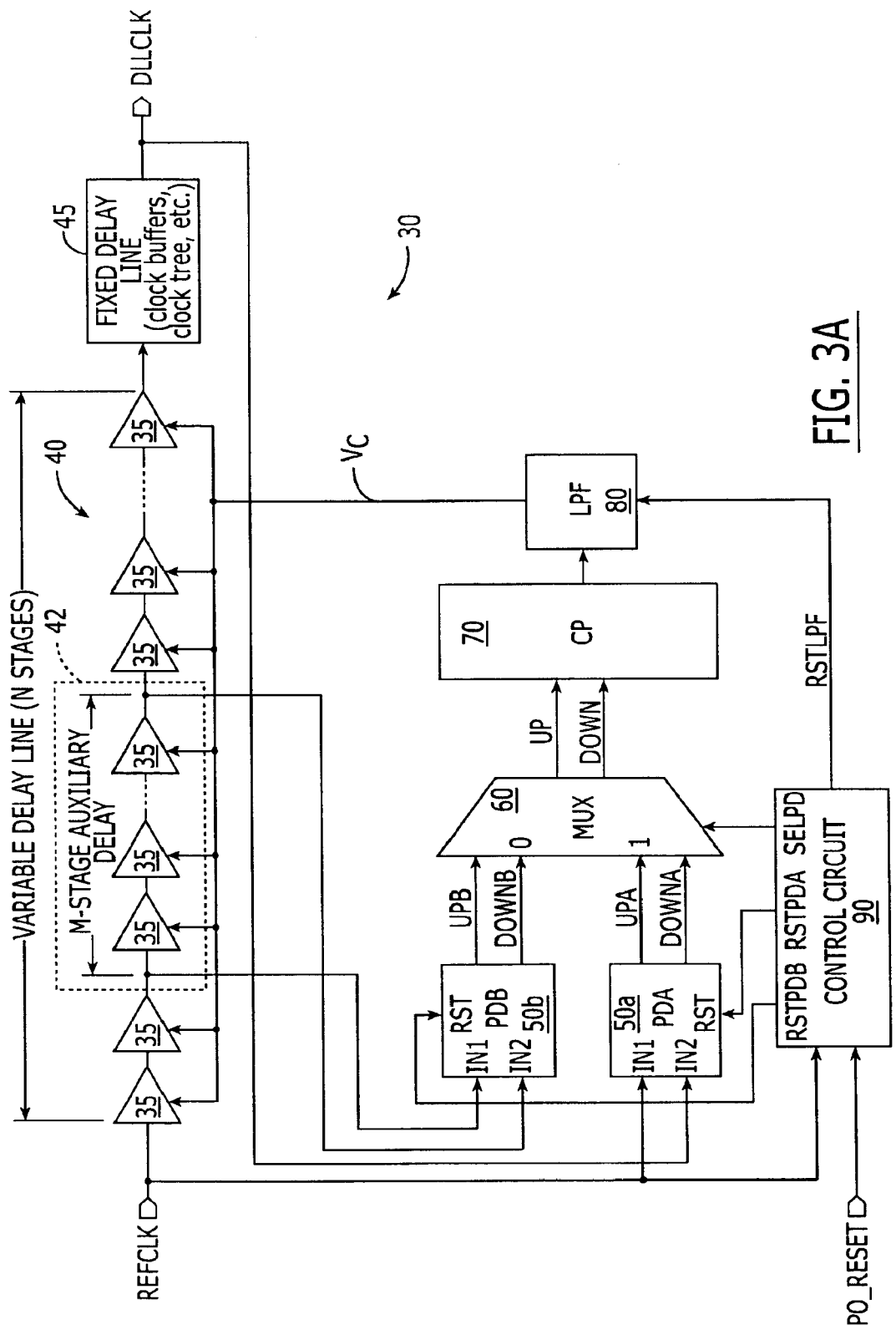
FIG. 3A is an electrical schematic of a delay-locked loop (DLL) according to an embodiment of the present invention.

Referring now to FIG. 3A, a delay-locked loop (DLL) 30 according to an embodiment of the present invention includes a variable delay line 40 that is responsive to a reference clock signal (REFCLK). This variable delay line is illustrated as having a plurality of variable delay stages 35 (shown as N stages). As will be understood by those skilled in the art, the delay provided by these stages 35 may be controlled by a control voltage ($V_C$) having a magnitude that may fluctuate within a range defined between minimum and maximum control voltages. The DLL is configured to generate a clock signal DLLCLK that is provided as an output clock signal and as a feedback clock signal to a main phase detector (PDA) 50a. A fixed delay line 45 is provided between the variable delay line 40 and an output of the DLL 30. The fixed delay line 45 may be defined by a plurality of elements (e.g., input clock buffer, output clock buffer, clock tree, etc.) that collectively provide a relatively fixed delay to a periodic signal generated at an output of the variable delay line 40. As described herein, the variable delay line 40 and the fixed delay line 45 collectively define a full feedback loop that extends from a first input of the main phase detector 50a, which receives the reference clock signal REFCLK, to a second input of the main phase detector 50a that receives the feedback clock signal (DLLCLK).

The DLL 30 further includes an auxiliary phase detector 50b having first and second inputs that are electrically connected to respective delay stages 35 within the variable delay line 40. As illustrated, the variable delay line 40 includes M delay stages 35 that define an auxiliary delay line 42. The first delay stage 35 in the auxiliary delay line 42 has an input that is electrically coupled to a first input (IN1) of the auxiliary phase detector 50b and the last delay stage 35 in the auxiliary delay line 42 has an output that is electrically connected to a second input (IN2) of the auxiliary phase detector 50b. The main phase detector 50a is configured to generate UPA and DOWNA signals (pulses) in response to detecting phase differences between the reference clock signal REFCLK and the feedback clock signal DLLCLK. The main phase detector 50a may constitute a three-state phase frequency detector of conventional design. The auxiliary phase detector 50b is configured to generated UPB and DOWNB signals (pulses) in response to detecting phase differences between the clock signals provided to the input and generated at the output of the auxiliary M-stage delay line 42. As described more fully hereinbelow, the auxiliary phase detector 50b may constitute an edge-triggered set-reset type (SR-type) phase detector. A multiplexer 60 is provided between the main and auxiliary phase detectors 50a and 50b and a charge pump (CP) 70, as illustrated. The multiplexer 60 is responsive to a select signal (shown as SELPD). When the select signal SELPD is set to a first logic level (e.g., logic 1), the signals UPA and DOWNA are provided to the charge pump 70. However, when the select signal SELPD is set to a second logic level (e.g., logic 0), the signals UPB and DOWNB are provided to the charge pump 70. The charge pump 70 is configured to drive a low pass filter (LPF) 80 using conventional techniques. In some embodiments, the generation of an UP pulse at the input of the charge pump 70 results in an increase (or decrease) in the magnitude of the control voltage $V_C$ and the generation of a DOWN pulse at the input of the charge pump 70 results in a decrease (or increase) in the magnitude of the control voltage $V_C$.

As will now be described more fully with reference to FIGS. 3A–3B, the DLL 30 operates by forcing the total delay line (i.e., the series combination of the variable delay line and the fixed delay line) to lock to two cycles of the reference clock signal REFCLK over a wide range of reference clock frequencies. As will be understood by those skilled in the art, if $t_{VAR(min)} + t_{FIXED} > T_{REFCLK}$ (where $t_{VAR(min)}$ represents the minimum delay provided by the variable delay line 40, $t_{FIXED}$ represents the delay provided by the fixed delay line 45 and $T_{REFCLK}$ is the period of the reference clock signal REFCLK), then the DLL 30 will lock to two cycles of the reference clock signal REFCLK. However, if $(t_{VAR(min)} + t_{FIXED} < T_{REFCLK})$, then the DLL 30 will lock to one cycle of the reference clock signal REFCLK when the auxiliary phase detector 50b is not utilized during start-up (i.e., during initial power-on or after reset). Accordingly, if the DLL 30 of FIG. 3A is utilized in the absence of the auxiliary phase detector 50b during start-up and is required to operate under both of these conditions, then there is a critical reference clock period where $t_{VAR(min)} + T_{FIXED} = T_{REFCLK}(\text{crit})$. When this occurs, the DLL 30 will lock to either one cycle or two cycles of the reference clock signal REFCLK. This condition is undesirable in may applications because if the DLL initially locks to one cycle (or two cycles) in the feedback path, then for varying power supply voltages and temperatures (where the delay of the fixed delay line 45 can vary), the DLL may re-lock to two cycles (or one cycle) or have excessive phase jitter.

To address this problem, the auxiliary phase detector 50b is used during start-up to set up a two cycle lock condition that can be maintained over a wide frequency range. Other forced lock conditions (e.g., 3 cycle lock) are also possible in alternative embodiments. This forced locking is achieved by using an auxiliary phase detector 50b to influence the value of the control voltage $V_C$ upon start-up (e.g., initial power-on or upon reset) and establish an intermediate locking state, before switching from the auxiliary phase detector 50a to the main phase detector 50b to establish a final locking state that can be supported over a wide frequency range. As illustrated by FIG. 3B, this "two-stage" locking sequence is commenced by switching a power-on reset signal (PO_RESET) from an active high level to an inactive low level to commence DLL operation. While the power-on reset signal PO_RESET is set high, the control circuit 90 in FIG. 3A operates to hold the low pass filter 80 in a reset mode. This causes the control voltage $V_C$ to be held at level sufficient to set the delay of the delay elements 35 in the variable delay line 40 at a minimum value (e.g., $V_C$=Vdd). As this is happening, both the main and auxiliary phase detectors 50a–50b and the charge pump 70 are disabled.

Once the power-on reset signal PO_RESET switches to an inactive low level (i.e., once a trailing edge of PO_RESET is detected by the control circuit 90), the auxiliary phase detector 50b is enabled and the multiplexer 60 is set to select the output signals UPB and DOWNB for output to the charge pump 70. By designing the auxiliary phase detector 50b as an edge-triggered SR-type phase detector, the M-stage auxiliary delay line 42, which represents just a portion of the full feedback loop, will lock to half a cycle of the reference clock signal REFCLK. In alternative embodiments, the portion of the full feedback loop defined by the auxiliary delay line can be locked to a full cycle of the reference clock signal REFCLK.

Based on an appropriate ratio of the length M of the auxiliary delay line 42 to the length N of the variable delay line 40, a half cycle lock condition at the inputs of the auxiliary phase detector 50b will cause the inputs (IN1 and IN2) of the main phase detector 50a to be offset by greater than 1.5 cycles of the reference clock signal REFCLK and less than 2.5 cycles of the reference clock signal REFCLK. Once the M-stages of the auxiliary delay line 42 are locked to half a clock cycle, the auxiliary phase detector 50b is disabled and the main phase detector 50a is enabled. The control circuit 90 performs this operation by simultaneously switching the reset signal RSTPDB low-to-high, switching the reset signal RSTPDA high-to-low and switching the select signal SELPD low-to-high to thereby cause the output signals UPA and DOWNA to be passed to the charge pump 70. This allows the main phase detector 50a to then lock the full feedback loop, which includes the variable delay line 60 and the fixed delay line 45, to two cycles of the reference clock signal REFCLK.

The point at which the auxiliary phase detector 50b is switched over to the main phase detector 50a is performed synchronously with the reference clock signal REFCLK. In particular, if the main phase detector 50a locks to the rising edges of its inputs, then the switch over is performed in-sync with a falling edge of the reference clock signal REFCLK, however, if the main phase detector 50a locks to the falling edges of its inputs, then the switch over is performed in-sync with a rising edge of the reference clock signal REFCLK. This insures that the first UPA pulse or DOWNA pulse out of the main phase detector 50a causes the full feedback loop to lock to two cycles of the reference clock signal REFCLK. The number of cycles of the reference clock signal REFCLK during which the auxiliary phase detector 50b is enabled in response to a reset event, is inversely proportional to the loop bandwidth of the auxiliary DLL loop (elements 42, 50b, 60, 70 and 80). Thus, a higher bandwidth requires fewer numbers of cycles of the reference clock signal REFCLK during which the auxiliary phase detector 50b is enabled.

Figure 3B:
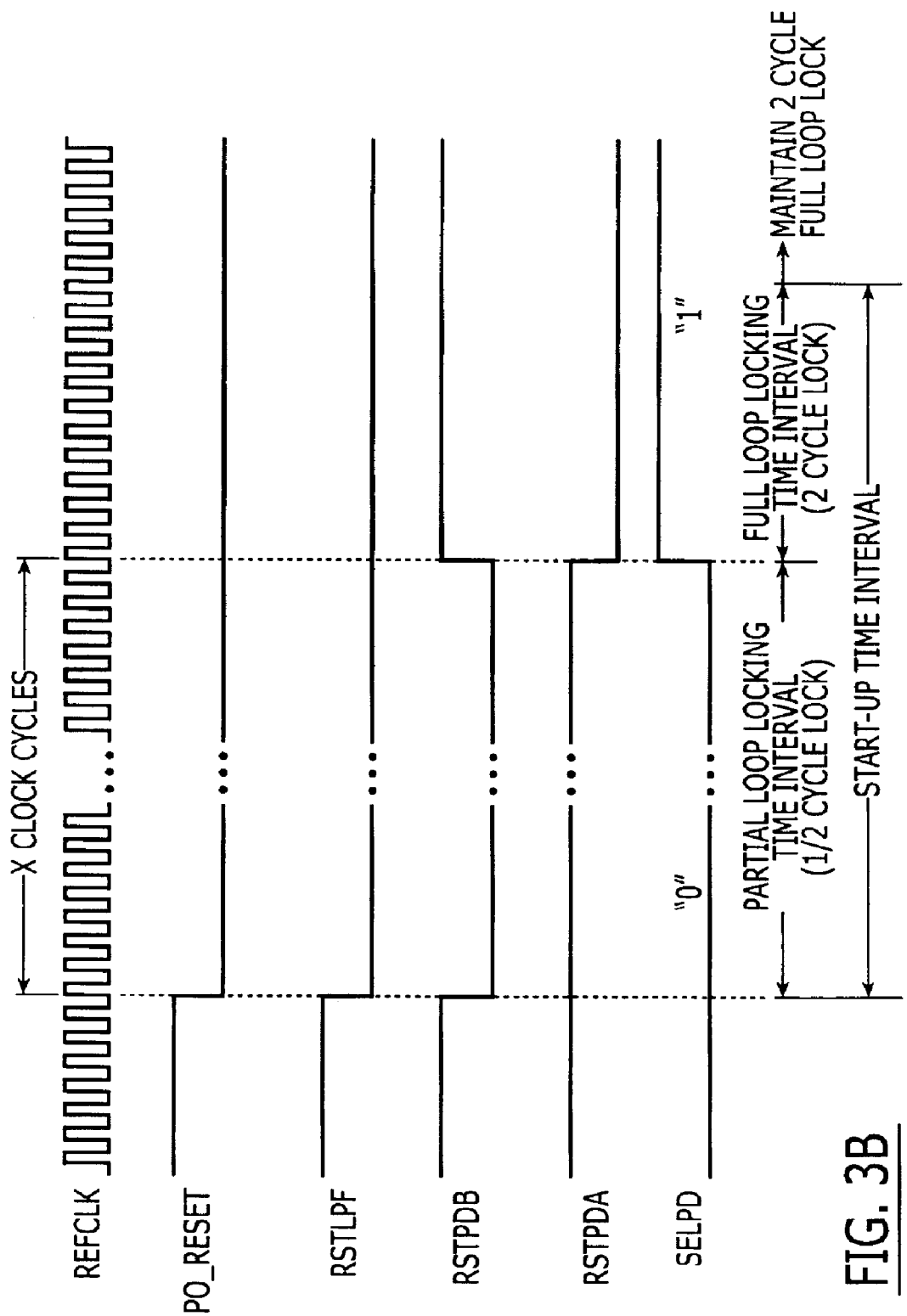
FIG. 3B is a timing diagram that illustrates operation of the DLL of FIG. 3A.

The auxiliary phase detector 50b should be kept enabled for a sufficient number of cycles (i.e., X cycles) of the reference clock signal REFCLK to insure a lock condition, as illustrated by FIG. 3B, where X may equal about 128 cycles in some embodiments. In this manner, the enablement of the main phase detector 50a is timed to a count of a number of cycles of the reference clock signal REFCLK. In alternative embodiments, a lock detector circuit (not shown) could be used within the control circuit 90 to detect when the auxiliary delay line 42 is locked. Upon detection of a lock condition, the auxiliary phase detector 50b and the lock detector circuit would be disabled and the main phase detector 50a would be enabled.

The number of delay elements 35 required in the variable delay line 40 is a function of the minimum clock pulse width associated with the reference clock signal REFCLK. In the illustrated embodiment, the length of the variable delay line 40 equals $^8(T_{REFCLK}/t_{PUL})$ where $t_{PUL}$ is the minimum high or low pulse width of the reference clock signal REFCLK. For a reference clock signal having a 50% duty cycle, N=16. This number of stages will allow the full feedback loop to lock to two cycles with minimum duty cycle distortion. The number M of delay elements 35 in the auxiliary delay line 42 is determined by the value of the delay provided by the fixed delay line 45, which may represent a collection of elements (e.g., input clock buffer, output clock buffer, tree and dummy register delays). In particular, the value of M is set so that when the auxiliary delay line 42 becomes locked, the total delay around the main feedback loop does not exceed 2.5 clock cycles at the minimum period of the reference clock signal REFCLK (i.e., maximum clock frequency). This value of M can be determined by solving equation (1):

$$\tfrac{1}{2}(N(T_{REFCLK}(\min))/M)+t_{FIXED}<\tfrac{1}{2}(5T_{REFCLK}(\min)) \tag{1}$$

The maximum period of the reference clock signal (i.e., minimum clock frequency) can then be determined from equation (2):

$$\tfrac{1}{2}(N(T_{REFCLK}(\max))/M)+t_{FIXED}<\tfrac{1}{2}(3T_{REFCLK}(\max)) \tag{2}$$

Based on these relationships, if the period of the reference clock signal REFCLK exceeds $T_{REFCLK}(\max)$, then the DLL 30 will lock to only one cycle of the reference clock signal REFCLK when the main phase detector 50a is enabled. This result is acceptable because $T_{REFCLK}(\max)$ is much greater than $T_{REFCLK}(\text{crit})$ and typical variations in power supply voltage and temperature will not cause the DLL 30 to relock (e.g., from two cycles to one cycle) or have excessive clock jitter.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a delay-locked loop (DLL) configured to support transition from a partial feedback loop lock condition to a full feedback loop lock condition during a start-up time interval.

2. The device of claim 1, wherein said DLL comprises:
   a variable delay line responsive to a reference clock signal;
   an auxiliary phase detector electrically coupled to said variable delay line; and
   a main phase detector responsive to the reference clock signal and a feedback clock signal.

3. The device of claim 2, wherein said auxiliary phase detector is: an edge-triggered SR-type phase detector.

4. The device of claim 2, wherein said auxiliary phase detector is an edge-triggered SR-type phase detector, and wherein said main phase detector is a three-state phase frequency detector.

5. The device of claim 2, wherein said DLL is responsive to the reference clock signal; and wherein the transition from the partial feedback loop lock condition to the full feedback loop lock condition is synchronized with the reference clock signal.

6. An integrated circuit device, comprising:
   a delay-locked loop (DLL) configured to support a jump from a partial clock cycle lock condition in a partial feedback loop to a two or more clock cycle lock condition in a full feedback loop that comprises the partial feedback loop, during a start-up time interval.

7. The device of claim 6, wherein said DLL comprises a variable delay line responsive to a reference clock signal; and wherein the jump in lock condition is synchronized with the reference clock signal.

8. The device of claim 6, wherein said DLL comprises a variable delay line and a fixed delay line that collectively define the full feedback loop.

9. The device of claim 6, wherein said DLL comprises:
   a variable delay line responsive to a reference clock signal;
   an auxiliary phase detector electrically coupled to said variable delay line; and
   a main phase detector responsive to the reference clock signal and a feedback clock signal.

10. The device of claim 9, wherein said auxiliary phase detector is an edge-triggered SR-type phase detector.

11. The device of claim 9, wherein said auxiliary phase detector is an edge-triggered SR-type phase detector; and wherein said main phase detector is a three-state phase frequency detector.

12. The device of claim 7, wherein said DLL comprises:
   a variable delay line responsive to the reference clock signal;
   a fixed delay line electrically coupled to an output of said variable delay line;
   an auxiliary phase detector electrically coupled to said variable delay line;
   a main phase detector responsive to the reference clock signal and a feedback clock signal generated at an output of said fixed delay line; and
   a control circuit responsive to the reference clock signal and a power-on reset signal, said control circuit configured to selectively enable said auxiliary phase detector and said main phase detector in sequence during a start-up time interval that commences upon receipt of a trailing edge of the power-on reset signal.

13. The device of claim 12, wherein said control circuit is further configured to time an enablement of the main phase detector during the start-up time interval to a count of a number of cycles of the reference clock signal.

14. The device of claim 13, wherein said DLL further comprises a multiplexer responsive to a select signal generated by said control circuit and having first and second pairs of inputs electrically coupled to said auxiliary phase detector and said main phase detector, respectively.

15. The device of claim 12, wherein said DLL further comprises a multiplexer responsive to a select signal generated by said control circuit and having first and second pairs of inputs electrically coupled to said auxiliary phase detector and said main phase detector, respectively.

16. The device of claim 15, wherein said DLL further comprises:
   a charge pump responsive to UP and DOWN signals provided by said multiplexer; and
   a filter having an input electrically coupled to an output of said charge pump and an output electrically coupled to bias terminals of said variable delay line.

17. An integrated circuit device, comprising:
   a delay-locked loop (DLL) configured to support a jump from half or full clock cycle locking of an auxiliary portion of a feedback loop to a two clock cycle locking of a full portion of the feedback loop during a start-up time interval.

18. The device of claim 17, wherein said DLL is responsive to a reference clock signal; and wherein a timing of the jump is synchronized with the reference clock signal.

19. The device of claim 18, wherein said DLL comprises:
   a variable delay line responsive to the reference clock signal;
   an auxiliary phase detector electrically coupled to said variable delay line; and
   a main phase detector responsive to the reference clock signal and a feedback clock signal.

20. The device of claim 19, wherein said auxiliary phase detector is an edge-triggered SR-type phase detector; and wherein said main phase detector is a three-state phase frequency detector.

* * * * *